(12) United States Patent
Lai et al.

(10) Patent No.: US 8,196,645 B2
(45) Date of Patent: Jun. 12, 2012

(54) HEAT SINK WITH HEAT PIPES

(75) Inventors: Chi-Yuan Lai, Taipei Hsien (TW); Zhi-Yong Zhou, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 1201 days.

(21) Appl. No.: 11/964,919

(22) Filed: Dec. 27, 2007

(65) Prior Publication Data

US 2009/0166000 A1 Jul. 2, 2009

(51) Int. Cl.
- *F28D 15/02* (2006.01)
- *F28F 7/00* (2006.01)
- *H05K 7/20* (2006.01)

(52) U.S. Cl. .................. 165/104.33; 165/80.3; 361/704

(58) Field of Classification Search .............. 361/704; 165/104.33

See application file for complete search history.

(56) References Cited

U.S. PATENT DOCUMENTS

| | | | | |
|---|---|---|---|---|
| 6,148,906 A * | 11/2000 | Li et al. | | 165/104.33 |
| 6,807,058 B2 * | 10/2004 | Matteson et al. | | 361/700 |
| 7,679,912 B1 * | 3/2010 | Xiong et al. | | 361/700 |
| 7,694,727 B2 * | 4/2010 | Yang et al. | | 165/104.33 |
| 7,746,642 B2 * | 6/2010 | Lai et al. | | 361/700 |
| 7,779,897 B2 * | 8/2010 | Jin et al. | | 165/104.33 |
| 7,866,376 B2 * | 1/2011 | Jiang et al. | | 165/104.33 |
| 2007/0000646 A1 * | 1/2007 | Chen et al. | | 165/104.33 |
| 2007/0074857 A1 * | 4/2007 | Xia et al. | | 165/104.33 |
| 2007/0107876 A1 * | 5/2007 | Xia et al. | | 165/104.26 |
| 2008/0017351 A1 * | 1/2008 | Zhou et al. | | 165/80.3 |
| 2008/0055855 A1 * | 3/2008 | Kamath et al. | | 361/700 |
| 2008/0093052 A1 * | 4/2008 | Yang et al. | | 165/80.3 |
| 2008/0115914 A1 * | 5/2008 | Yang et al. | | 165/104.33 |
| 2008/0142192 A1 * | 6/2008 | Yu et al. | | 165/80.3 |
| 2008/0173430 A1 * | 7/2008 | Jin et al. | | 165/104.33 |
| 2008/0289798 A1 * | 11/2008 | Min et al. | | 165/80.3 |
| 2008/0310122 A1 * | 12/2008 | Chou et al. | | 361/720 |
| 2008/0314556 A1 * | 12/2008 | Zhou et al. | | 165/80.3 |
| 2009/0016023 A1 * | 1/2009 | Cao et al. | | 361/702 |
| 2009/0151898 A1 * | 6/2009 | Lai et al. | | 165/80.3 |
| 2009/0151921 A1 * | 6/2009 | Lai et al. | | 165/185 |
| 2009/0159252 A1 * | 6/2009 | Lai et al. | | 165/171 |
| 2009/0266513 A1 * | 10/2009 | Xiong et al. | | 165/80.3 |

* cited by examiner

Primary Examiner — Cheryl J Tyler
Assistant Examiner — Brandon M Rosati
(74) Attorney, Agent, or Firm — Altis Law Group, Inc.

(57) ABSTRACT

A heat sink adapter for cooling an electronic component includes a lower plate, an upper plate, an upper fin set and a lower fin set respectively fixed on the upper plate and the lower plate, and a plurality of heat pipes sandwiched between the upper plate and the lower plate. The lower plate includes a panel contacting the heat pipes, two sidewalls extending upwardly from the panel and separated from the heat pipes, and two flanges extending oppositely from the two sidewalls and soldered on the upper plate. The heat pipes are S-shaped and juxtaposed and directly contact with each other from beginning to end.

6 Claims, 5 Drawing Sheets

HEAT SINK WITH HEAT PIPES

BACKGROUND OF THE INVENTION

1. Field of the Invention

The present invention relates to a heat sink, and more particularly to a heat sink incorporating heat pipes for enhancing a heat dissipating efficiency thereof.

2. Description of Related Art

The central processing unit (CPU) mounted on the motherboard in a computer is the center of operations of the computer. During the operations of the computer, the CPU produces heat. The heat must be quickly carried away from the CPU during the operations of the computer. Accordingly, a heat sink is used to remove the heat from the CPU.

Conventionally, a heat sink includes a metal base contacting with the CPU to absorb heat therefrom, and a plurality of fins extending from the base to dissipate the heat to an ambient. In order to increase a heat dissipating efficiency, heat pipes are often embedded into the metal base to transfer the heat from the metal base to the fins more rapidly.

In most of the heat sinks, the heat pipes are accommodated in grooves which are defined in the metal base. However, the process to form the grooves in the metal base is costly since it needs a hard machine work. Furthermore, in order to receive the heat pipes therein substantially, the metal base should be made having a thickness larger than diameters of the grooves, whereby a material cost of the metal base is increased.

What is needed, therefore, is a heat dissipating device which can overcome the above-mentioned disadvantages.

SUMMARY OF THE INVENTION

A heat sink adapter for cooling an electronic component includes a lower plate, a planar upper plate, an upper fin set and a lower fin set respectively fixed on the upper plate and the lower plate, and a plurality of heat pipes sandwiched between the upper plate and the lower plate. The lower plate includes a planar panel contacting the heat pipes, two sidewalls extending upwardly from the panel and separated from the heat pipes, and two flanges extending oppositely from the two sidewalls and soldered on the upper plate. In one embodiment of the present invention, the heat pipes each have an S shape. In another embodiment of the present invention, the heat pipes includes a middle S-shaped heat pipe and two lateral U-shaped heat pipes. The heat pipes of the two embodiments are all juxtaposed and directly contact with each other from beginning to end. Compared with the conventional heat sink that forms the grooves in the base to retain the heat pipes therein, the heat sink of the present invention does not need forming grooves in the lower plate, whereby a material cost and a machine work are reduced and avoided, respectively.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
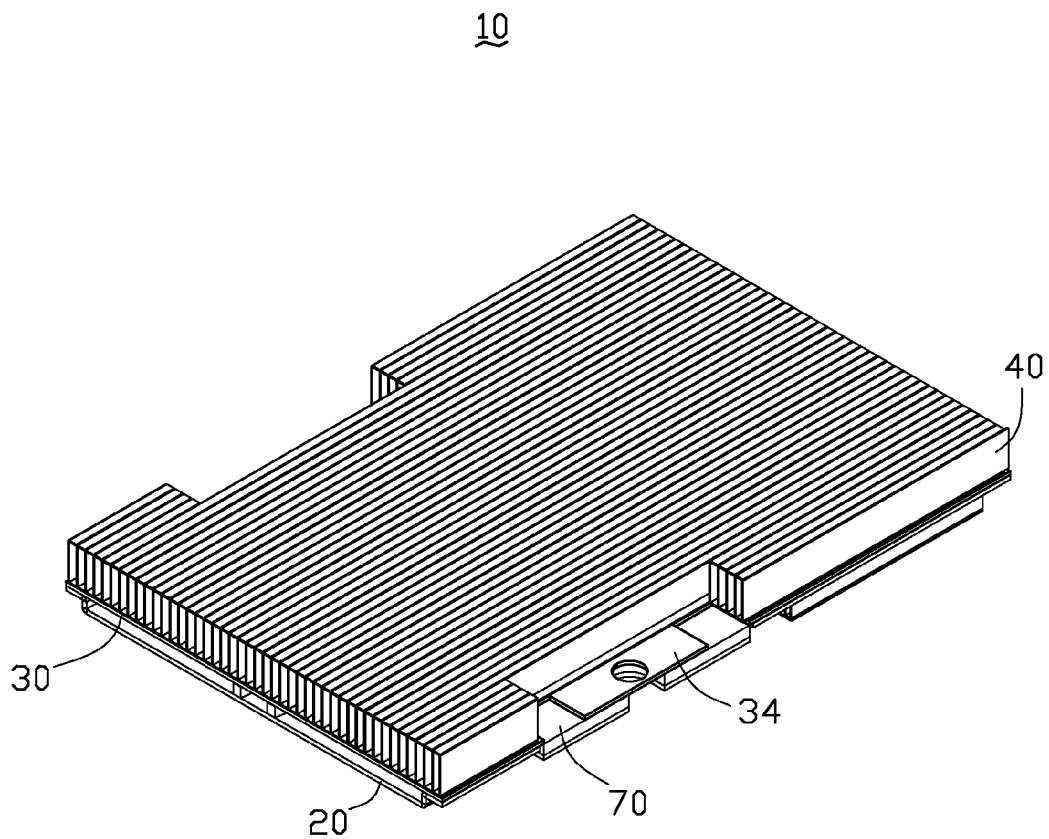
FIG. 1 is an assembled, isometric view of a heat sink in accordance with a preferred embodiment of the present invention.
Figure 2:
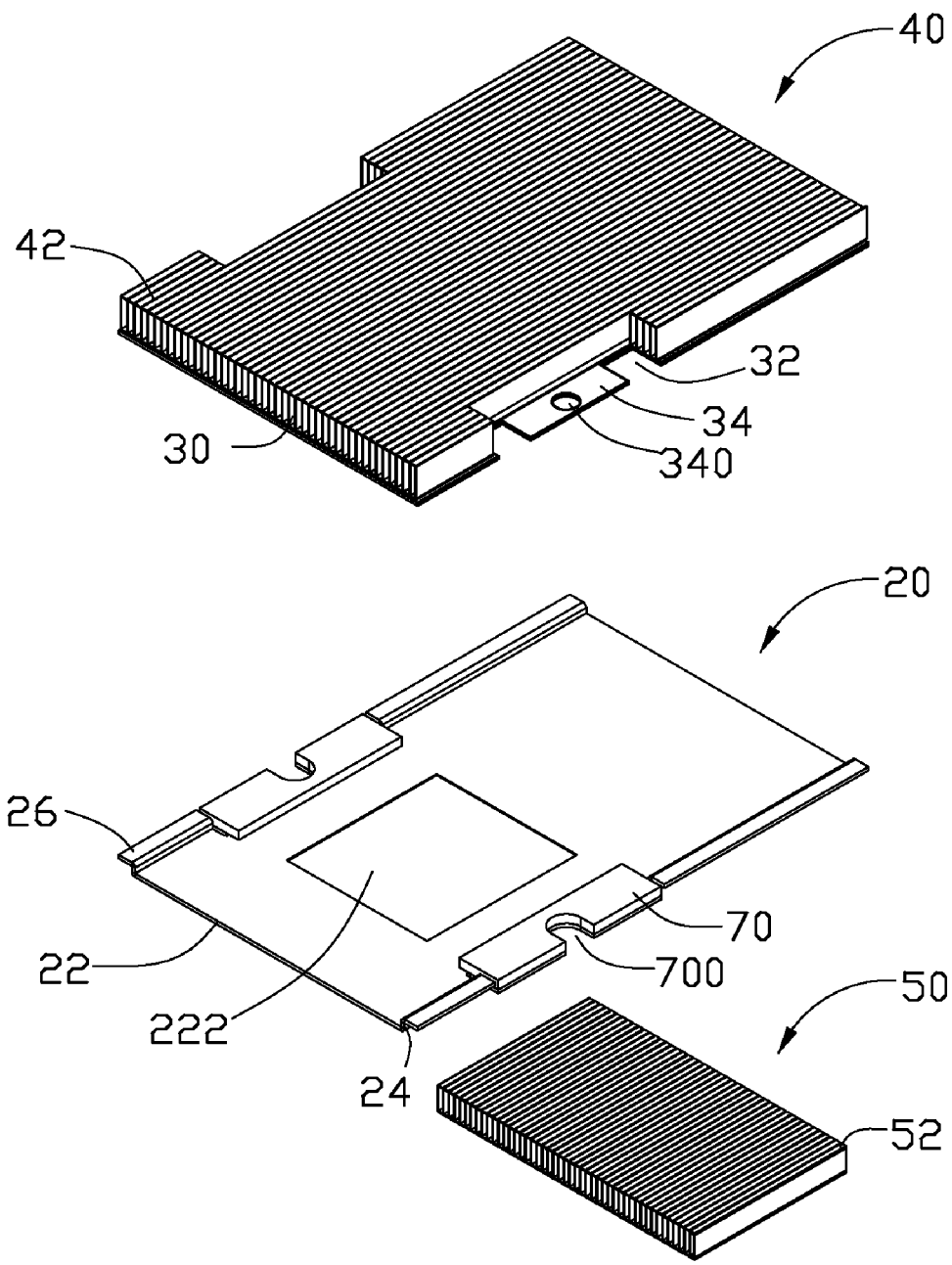
FIG. 2 is an exploded view of FIG. 1 with heat pipes of the heat sink being removed.
Figure 3:
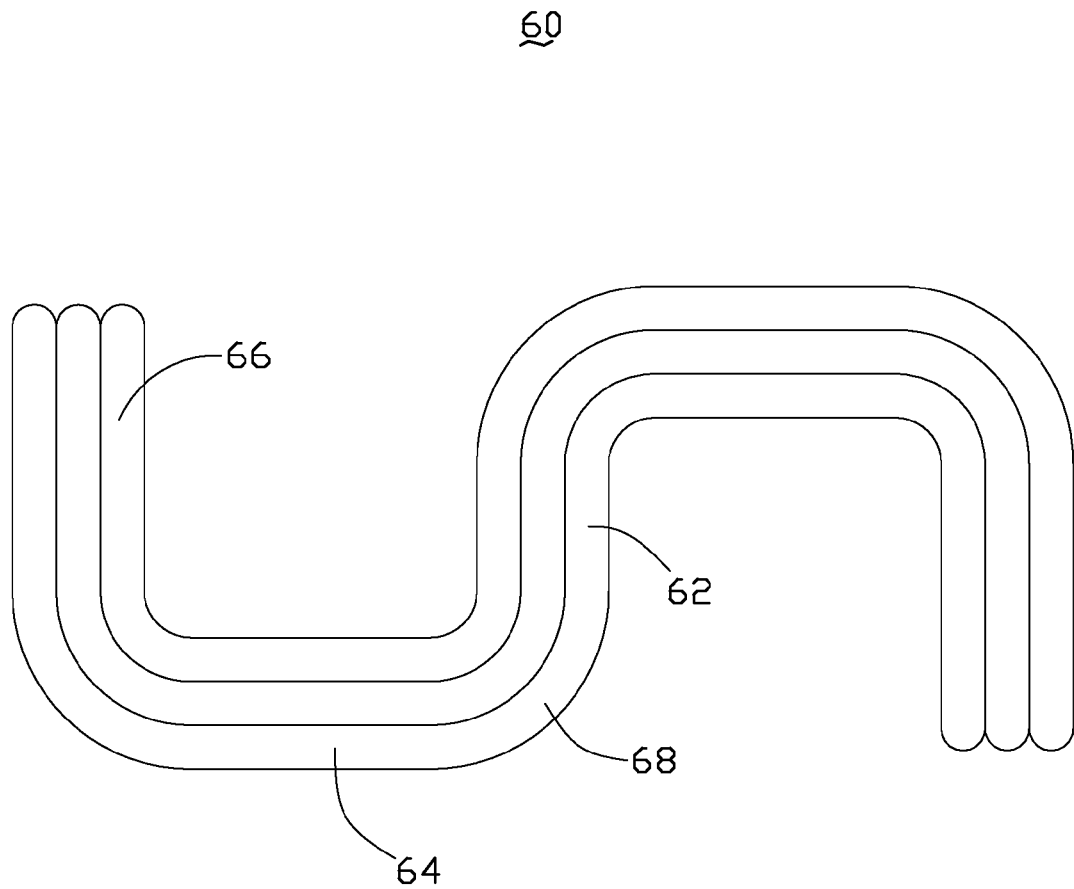
FIG. 3 is a top view of the heat pipes removed from FIG. 2.

Referring to FIGS. 1-3, a heat sink 10 in accordance with a preferred embodiment of the present invention is for being mounted on an electronic component (not shown) to dissipate heat therefrom. The heat sink 10 comprises a lower plate 20, an upper plate 30, a plurality of heat pipes 60 sandwiched between the lower plate 20 and the upper plate 30, and an upper fin set 40 and a lower fin set 50 attached on the upper plate 30 and the lower plate 20, respectively.

Figure 4:
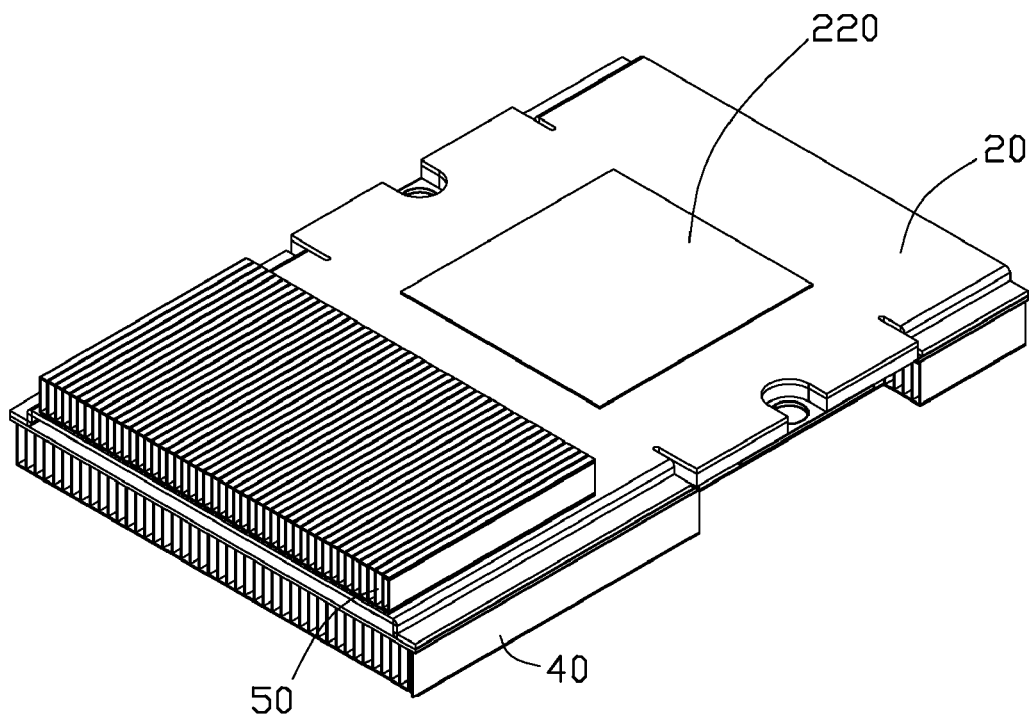
FIG. 4 is an inverted view of FIG. 1.

Also referring to FIG. 4, the lower plate 20 is made by bending a metal plate, it comprises a rectangular and planar panel 22, a pair of sidewalls 24 extending upwardly and perpendicularly from two opposite lateral sides of the panel 22, and a pair of flanges 26 formed horizontally and oppositely from tops of the pair of sidewalls 24, respectively. A square area of the panel 22 is stamped downwardly to form a protrusion 220 (shown in FIG. 4) projecting beyond a bottom face the panel 22, which is adapted for contacting the electronic component to absorb heat therefrom. A cavity 222 is defined corresponding to the protrusion 220 and beneath a top face of the panel 22 for partially receiving the heat pipes 60 therein. In the preferred embodiment of the present invention, the protrusion 220 is located approximating to a central part of the panel 22; nevertheless, a location of the protrusion 220 on the panel 22 can be changed according to positions of the electronic component. Corresponding portions of the sidewalls 24 and the flanges 26 are bent outwardly and oppositely to form a pair of horizontal wings (not labeled) at two lateral sides of the lower plate 20, respectively. A pair of rectangular securing members 70 are disposed on the two wings of the lower plate 20 and inserted into the flanges 26 and the sidewalls 24, with an outer side thereof being coincidental with an outer edge of a corresponding wing. Each of the securing members 70 has a height larger than that of the sidewalls 24, whereby a top of the each securing member 70 extends beyond the flanges 26. A hole 700 is defined through each securing member 70 and each wing to provide a passage for a fastener (not shown).

The upper plate 30 is soldered on the two flanges 26 of the lower plate 20. The upper plate 30 has a periphery coincidental with a profile of the lower plate 20. A pair of cutouts 32 are defined at each lateral side of the upper plate 30 corresponding to one of the wings, while a part of the upper plate 30 located between the pair of cutouts 32 forms a rectangular tab 34, which is for resiliently abutting against a corresponding securing member 70. Total areas of the two cutouts 32 and the tab 34 located at a common side of the upper plate 30 are identical to an area of the securing member 70 (illustrated in FIG. 1). A circular hole 340 is defined in each tab 34 corresponding to the hole 700 in the lower plate 20 and the securing member 70. The fastener extends through the circular hole 340 of the upper plate 20 and a corresponding hole 700 of the lower plate 20 and the securing member 70 to attach them on a printed circuit board (not shown) where the electronic component is mounted.

The upper fin set 40 and the lower fin set 50 are fixed on the upper plate 30 and the lower plate 20 by soldering, respectively. Each of the upper fin set 40 and the lower fin set 50 comprises a plurality of parallel fins 42, 52, each of which consists of an upright sheet (now labeled) and a pair of pieces (not labeled) bent horizontally from a top and a bottom of the sheet, respectively. The lower fin set 50 is secured on a rear part of the bottom face of the panel 22 and near the protrusion 220 (viewed from FIG. 4), by soldering upper pieces of the fins 52 on the panel 22; the upper fin set 40 is secured on a whole top face of the upper plate 30, by soldering lower pieces of the fins 42 on the upper plate 30, wherein every two adjacent fins 42, 52 form a passage therebetween for allowing an airflow therethrough. The lower fin set 50 has a width similar to that of the panel 22 and occupies nearly a half area of the bottom face of the panel 22 of the lower plate 20, and the upper fin set 40 has a profile coincidental to that of the upper plate 30 and a width larger than that of the lower fin set 50 (shown in FIG. 4).

As shown in FIGS. 2-3, the heat pipes 60 are sandwiched between the upper plate 30 and the lower plate 20. In the preferred embodiment of the present invention, there are three identical heat pipes 60; however, it can be understood for a skilled one in the related art that an amount of the heat pipes 60 can be adjusted according to a quantity of the heat that the electronic component generates. The three heat pipes 60 are S-shaped, and juxtaposed to and directly contact with each other from beginning to end. Each heat pipe 60 comprises an evaporating section 62, a pair of connecting sections 64 extending perpendicularly and oppositely from two distal ends of the evaporating section 62, and a pair of condensing sections 66 formed oppositely from extremities of the pair of connecting sections 64 and parallel to the evaporating section 62, respectively. Each of the evaporating sections 62, the connecting sections 64, and the condensing sections 66 is straight, and each joint 68 of respective evaporating sections 62, connecting sections 64, and condensing sections 66 is arced. A length of each connecting section 64 is larger than that of each evaporating section 62, and similar to that of the condensing section 66. Each evaporating section 62 forms a bulge (not shown) projecting downwardly from a bottom thereof, which is for being received in the cavity 222 of the lower plate 20 and contacting the protrusion 220, thereby to transfer heat from the protrusion 220 to the heat pipes 60.

In use, the heat sink 10 is disposed on the printed circuit board with its protrusion 220 contacting with the electronic component, wherein the upper fin set 40 is located above the printed circuit board, and the lower fin set 50 extends downwardly beyond the printed circuit board and has a part located lower than the printed circuit board. The heat generated by the electronic component is absorbed by the protrusion 220, and then is transferred to other portions of the heat pipes 60 via the bulges. The heat pipes 60 distribute the heat over the upper plate 30 and the lower plate 20, which disperses the heat to the ambient via the lower fin set 50 and the upper fin set 40.

Figure 5:
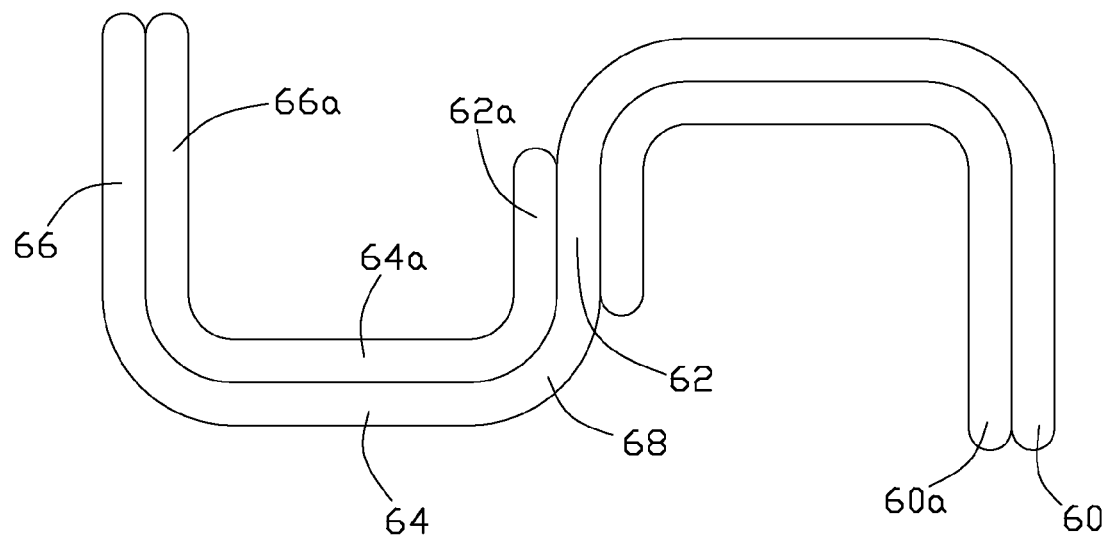
FIG. 5 is a top view of heat pipes of another heat sink in accordance with another embodiment of the present invention.

FIG. 5 shows another embodiment of the present invention, wherein the heat pipes 60,60a thereof are partially different from the heat pipes 60 of the above embodiment. The number of the heat pipes 60, 60a of this another embodiment is also three: two lateral heat pipes 60a are shorten for reducing a total cost of the heat sink 10. A middle heat pipe 60 remains its original shape, which is similar to a letter "S"; the two lateral heat pipes 60a sandwich the middle heat pipe 60 therebetween, each of which is approximately U-shaped and comprises an evaporating section 62a, a condensing section 66a parallel to the evaporating section 62a, and a connecting section 64a vertically interconnecting the evaporating section 62a and the condensing section 66a. The two lateral heat pipes 60a are arranged opposite to each other and against the middle heat pipe 60 in a manner such that the evaporating sections 62, 62a of the three heat pipes 60, 60a are juxtaposed with each other and located corresponding to the cavity 222 of the lower plate 20, the connecting section 64a and the condensing section 66a of one of the two lateral heat pipes 60a abut side-by-side against one of the pair of connecting sections 64 and one of the pair of condensing sections 66 of the middle heat pipe 60, the connecting section 64a and the condensing section 66a of another one of the two lateral heat pipes 60a abut side-by-side against another one of the pair of connecting sections 64 and another one of the pair of condensing sections 66 of the middle heat pipe 60, respectively. In other words, the heat pipes 60 has three evaporating sections 62, 62a located near a middle of the lower plate 20, and two condensing sections 66, 66a located at each of front and rear sides of the lower plate 20.

In contrast to the conventional heat sink which forms grooves in a base to accommodate heat pipes therein, the lower plate 20 of the present invention does not need forming any grooves since the heat pipes 60, 60a are sandwiched between the lower plate 20 and the upper plate 30 and directly welded on the lower plate 20, whereby no machine work is needed and a thickness of the lower plate 20 is capable of being controlled in a small range; thus, a machine cost and material cost of the heat sink 10 is reduced.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. A heat sink for dissipating heat from an electronic component, the heat sink comprising:
   a planar upper plate;
   a planar lower plate secured on the upper plate; and
   a plurality of heat pipes sandwiched between the upper plate and the lower plate,
   wherein the plurality of heat pipes comprises an S-shaped middle heat pipe, a U-shaped first heat pipe and a U-shaped second heat pipe, the middle heat pipe comprising a middle evaporating section, and a first condensing section and a second condensing section parallel to the middle evaporating section and arranged at two opposite lateral sides of the middle evaporating section, the first heat pipe being entirely arranged between the middle evaporating section and the first condensing section of the middle heat pipe, the second heat pipe being entirely arranged between the middle evaporating section and the second condensing section of the middle heat pipe;
   wherein the first heat pipe comprises a first evaporating section directly contacting the middle evaporating section of the middle heat pipe, a third condensing section directly contacting the first condensing section of the middle heat pipe, and a connecting section interconnecting the first evaporating section and the third condensing section, and
   wherein the second heat pipe comprises a second evaporating section directly contacting the middle evaporating section of the middle heat pipe, a fourth condensing section directly contacting the second condensing sec- tion of the middle heat pipe, and a connecting section interconnecting the second evaporating section and the fourth condensing section.

2. The heat sink as claimed in claim 1, wherein the middle heat pipe further comprises a first connecting section connecting the middle evaporating section and the first condensing section and a second connecting section connecting the middle evaporating section and the second condensing section, the middle evaporating section being substantially perpendicular to the first and second connecting sections, the first connecting section of the middle heat pipe directly contacting the connecting section of the first heat pipe, the second connecting section of the middle heat pipe directly contacting the connecting section of the second heat pipe.

3. The heat sink as claimed in claim 1, further comprising an upper fin set attached on the upper plate and a lower fin set attached on the lower plate, wherein the upper fin set occupies a total top face of the upper plate, and the lower fin set only covers a lateral portion a bottom face of the lower plate with another portion of the bottom face of the lower plate being exposed for contacting the electronic component.

4. The heat sink as claimed in claim 1, wherein the lower plate comprises a panel contacting the plurality of heat pipes, a pair of sidewalls extending upwardly from two opposite lateral sides of the panel, and a pair of flanges extending oppositely and horizontally from tops of the pair of sidewalls, respectively, the plurality of heat pipes being fixed on an upper face of the panel facing the upper plate and spaced from the pair of sidewalls, the upper plate being fixed on the flanges of the lower plate.

5. The heat sink as claimed in claim 4, further comprising an upper fin set arranged on the upper plate and a lower fin set attached to a bottom face of the panel of the lower plate, wherein the upper fin set occupies a whole top face of the upper plate and the lower fin set occupies only a portion of the bottom face of the panel of the lower plate with another portion of the bottom face of the lower plate being exposed for contacting the electronic component.

6. The heat sink as claimed in claim 4, further comprising a pair of securing members seated into the pair of sidewalls and flanges, wherein the pair of securing members are higher than the pair of sidewalls and abut against the upper plate.

* * * * *